United States Patent
Wang et al.

(10) Patent No.: US 7,863,960 B2
(45) Date of Patent: Jan. 4, 2011

(54) THREE-DIMENSIONAL CHIP-STACK SYNCHRONIZATION

(75) Inventors: Ping-Chuan Wang, Hopewell Jct., NY (US); Anthony R. Bonaccio, Essex Jct., VT (US); Jong-Ru Guo, Hopewell Jct., NY (US); Louis Lu-Chen Hsu, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 54 days.

(21) Appl. No.: 12/432,801

(22) Filed: Apr. 30, 2009

(65) Prior Publication Data
US 2010/0277210 A1      Nov. 4, 2010

(51) Int. Cl.
G06F 1/04           (2006.01)
(52) U.S. Cl. .................. 327/291; 327/295; 327/565
(58) Field of Classification Search ......... 327/291–293, 327/295, 403, 415, 564, 565; 257/686, 777, 257/778
See application file for complete search history.

(56) References Cited

U.S. PATENT DOCUMENTS

| 5,760,478 | A | 6/1998 | Bozso et al. |
| 6,040,203 | A | 3/2000 | Bozso et al. |
| 6,526,112 | B1 | 2/2003 | Lai |
| 7,538,603 | B2 * | 5/2009 | Ikeda et al. ............ 327/565 |

* cited by examiner

*Primary Examiner*—An T Luu
(74) *Attorney, Agent, or Firm*—H. Daniel Schnurmann (57) ABSTRACT

A central reference clock is placed in a substantially middle chip of a 3-D chip-stack. The central reference clock is distributed to each child chip of the 3-D chip-stack, so that a plurality of clocks is generated for each individual chip in the 3-D-stack in a synchronous manner. A predetermined number of through-silicon-vias and on-chip wires are employed to form a delay element for each slave clock, ensuring that the clock generated for each child chip is substantially synchronized. Optionally, an on-chip clock trimming circuit is embedded for further precision tuning to eliminate local clock skews.

26 Claims, 10 Drawing Sheets

THREE-DIMENSIONAL CHIP-STACK SYNCHRONIZATION

FIELD OF THE INVENTION

The present invention relates to a clock distribution system of a microelectronic chip package, and more particularly, to a system and a method for synchronizing a three-dimension (3-D) chip-stack clock distribution.

BACKGROUND AND RELATED ART

In the semiconductor industry, electronic devices including semiconductor chips and wafers or semiconductor chip carriers, vertical interconnection to the next packaging level, whether chip carriers or stacked chips, may be packaged by the use of through-silicon vias (labeled TSVs). Various techniques are known to create TSVs, as well as to stack chips to form a multi-story chip structure that is sometimes referred to as a 3-D chip stack, allowing reduced die-to-die signal transmission distance and enabling a large increase in the number of links that may be established between dies.

Small-sized packages, as provided by 3-D chip stacks using TSVs, are in high demand for a variety of applications, such as cell phones, digital cameras, PDAs, GPSs, laptop computers, and the like. The continuing growth of these applications requires on-going efforts to boost performance, broaden functionalities, reduce cost and increase packaging densities.

One of many difficulties with such structures is how to synchronize the clock signal among the various chips forming the stack once they are assembled. The aforementioned difficulty may not necessarily extend to all the chip packages if the chips do not operate in a synchronous manner. By way of example, if the chips in the 3-D-stack are used for mass storage, it is not necessary that they be synchronized with each other. However, if each chip perform the function of a processor such as a high-speed multi-processor system or when each chip is a component of a processor, then the synchronization between the chips becomes critical.

The prior art represented by, e.g., U.S. Pat. No. 5,760,478 to Bozso, et al., or U.S. Pat. No. 6,040,203, likewise issued to Bozso et al., respectively describe a precise and highly controllable clock-distribution network constructed on one active substrate to distribute clock signals with minimal skew to another active substrate by connecting the substrates together face-to-face using flip-chip technology. This approach is only valid for two chips bonded face-to-face to each other, and is further limited by not being able to handle the clock skew when a plurality of chips are assembled in 3-D stack where clock signals must travel through many levels of chips and TSVs before it arrives at each chip.

SUMMARY OF THE INVENTION

In accordance with an embodiment, the invention provides an apparatus and a method for creating a clock distribution having clock signals in each chip forming a 3-D stack to be synchronized.

In one aspect of the invention, the clock distribution system enables clock signals of each individual child chip stacked above or below the middle chip located in the middle of the 3-D stack to be synchronized to a master clock positioned in the middle chip.

In yet another aspect, a central reference clock is placed in the middle chip of the chip stack, wherein the central reference clock signals are distributed to a PLL-based local clock in each individual chip of the 3-D stack, generating local clock signals to corresponding chips.

In a further aspect of the invention, the central reference clock feeds the PLL-based master clock in the middle chip, and an output from a charge pump in the master clock is linked to the local VCO located in each individual chip, generating local clock signals in the corresponding chips in the stack.

In yet another aspect, the output of each VCO in each chip is linked by way of its corresponding divider to a multiplexer (MUX) in the middle chip, wherein the MUX scans through all the channels in order to periodically lock the clock phase of each chip within the stack.

In a further aspect of the invention, the output from the charge pump in the middle chip is distributed to each individual chip in the 3-D stack with delay compensation using TSVs and on-chip metal wirings, wherein designated number of TSVs and a predetermined length of on-chip metal wires are used to provide a route between the master clock and the local VCO's of each individual chip in order to provide proper delay compensation and achieve an overall clock synchronization.

In still a further aspect of the invention, a precision clock tuning device in each child chip of the 3-D stack individually tunes the clock of each child chip. Such device can provide coarse and fine tuning of the on-chip clock regarding the central reference clock in the middle chip, and store the codes into a local register memory. During a power-on sequence, the codes are loaded to the tuning device of each child chip of the 3-D stack.

The invention further shows a formation of components of the grid, wires, through silicon vias (TSVs) and PLLs. The present invention provides a significant advance over the two dimensional H-tree clock grids known in the art by creating an analogous structure in a 3-D dimensional chip stack using TSVs or some equivalent technology elements. The value of these clock topologies is that a signal propagating from the clock PLL through the clock tree to the clock gated latches requires the clock signal to reach all the gated latches within a few picoseconds of each other. Thus, the clock skew is minimized. The minimal role for active devices or coupling to signal through passive device elements minimizes the clock skew and clock jitter, in a 3-D chip stack dependent on the TSVs using an odd number of TSVs for 2n+1 neighboring chips and an even number of TSVs for 2n neighboring chips. In addition, the invention preferably creates a delay line in series with the even number of TSVs that matches the delay associated the extra TSV on the interconnect to the 2n+1 neighbors.

In one embodiment, the present invention provides a clock system of a synchronous 3-D-stack formed by a plurality of chips that includes: a PLL-type master clock generator positioned in a chip substantially in the middle of the 3-D-stack; and PLL links having substantially an identical impedance, each PLL link servicing one of the chips, each of the PLL links connecting a central reference clock located in the middle chip to a local PLL link corresponding to the chip.

In another embodiment, the invention provides a clock system of a synchronous 3-D-stack that includes: a PLL-typed master clock generator placed in a substantially middle chip; a per-chip PLL link having a substantially identical impedance connecting a central reference clock in the substantially middle chip, and a local voltage-controlled oscillator (VCO) circuit positioned in a corresponding chip; a local VCO located in each chip feeding back a phase-frequency detector (PFD) on the substantially middle chip via a corresponding divider (/m); and a multiplexer (MUX) positioned between the feedback paths and the PFD for clock signal selection.

In still another embodiment, a method of synchronizing a clock system of a 3-D-stack formed by a plurality of chips is provided, the method including: placing a PLL-type master clock generator in a chip substantially in the middle of the 3-D-stack; and respectively linking PLLs having a substantially identical impedance to each of the chips, and connecting each of the PLL links to a central reference clock located in the middle chip to a local PLL link corresponding to the chip.

BRIEF DESCRIPTION OF THE DRAWINGS

The accompanying drawings, which are incorporated in and which constitute part of the specification, illustrate the presently preferred embodiments of the invention which, together with the general description given above and the detailed description of the preferred embodiments given below serve to explain the principles of the invention.

DETAILED DESCRIPTION

The present invention and the various features and advantageous details thereof are explained more fully with reference to the non-limiting embodiments that are illustrated in the accompanying drawings and detailed in the following description of embodiments of the invention.

Figure 1:
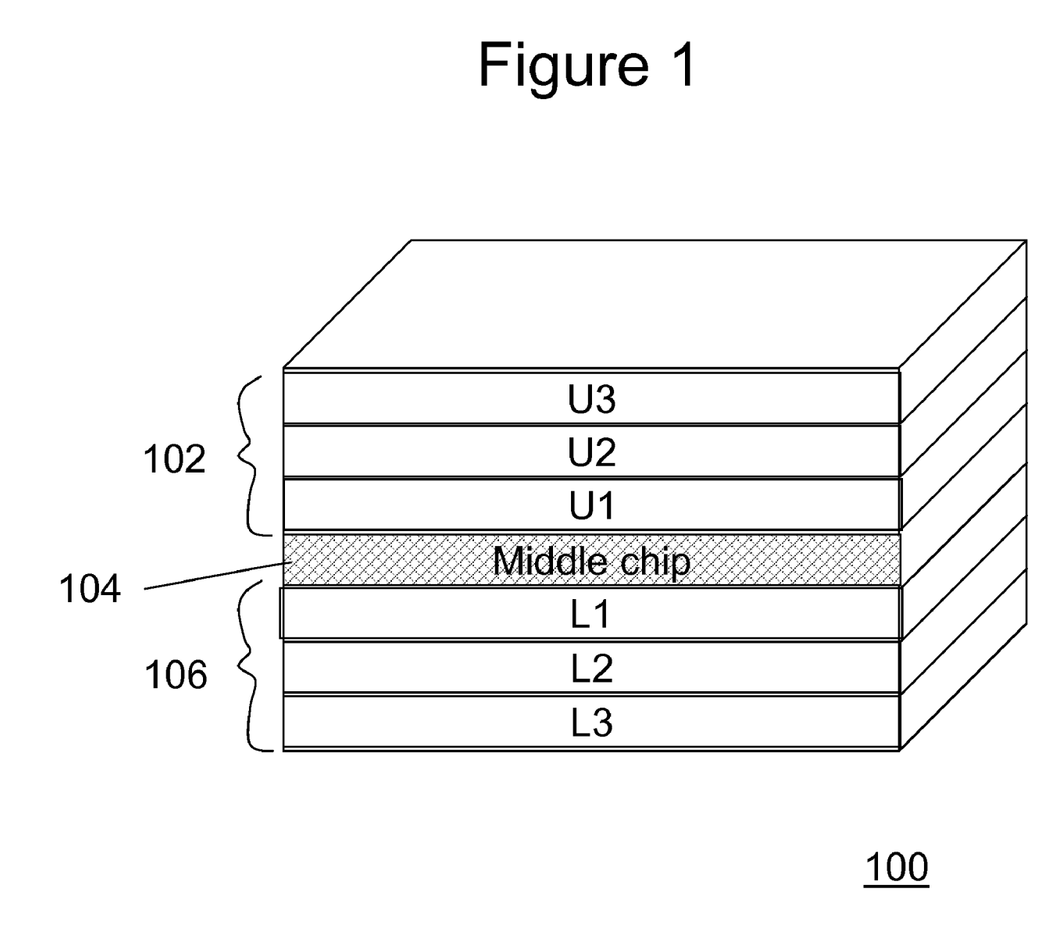
FIG. 1 illustrates a 3-D stacked chip, according to an embodiment of the present invention.

Referring to FIG. 1, there is shown an embodiment of a stacked chip structure 100. Although seven chips are shown, it is to be understood that other number of chips may be stacked to form the chip stack. In this example, a central reference clock is preferably placed in a middle chip 104 and a plurality of reference clock signals are routed to three upper chips 102 (U1, U2 and U3) ("child chip") and three lower chips 106 (L1, L2 and L3) ("child chip").

In general, such chips may be fabricated at the wafer level with standard devices and circuits formed in layers of the front-end of line (FEOL). Interconnects and dielectrics are then formed in layers of back-end of line (BEOL). All the chips are aligned and joined through a plurality of through silicon vias (TSVs). Note that the fabrication of TSVs for chip stacking has been described by the prior art, such as U.S. Pat. No. 7,276,780, and it is not the subject of present disclosure. Also, to avoid congestion, these features are not shown in the diagram.

Figure 2A:
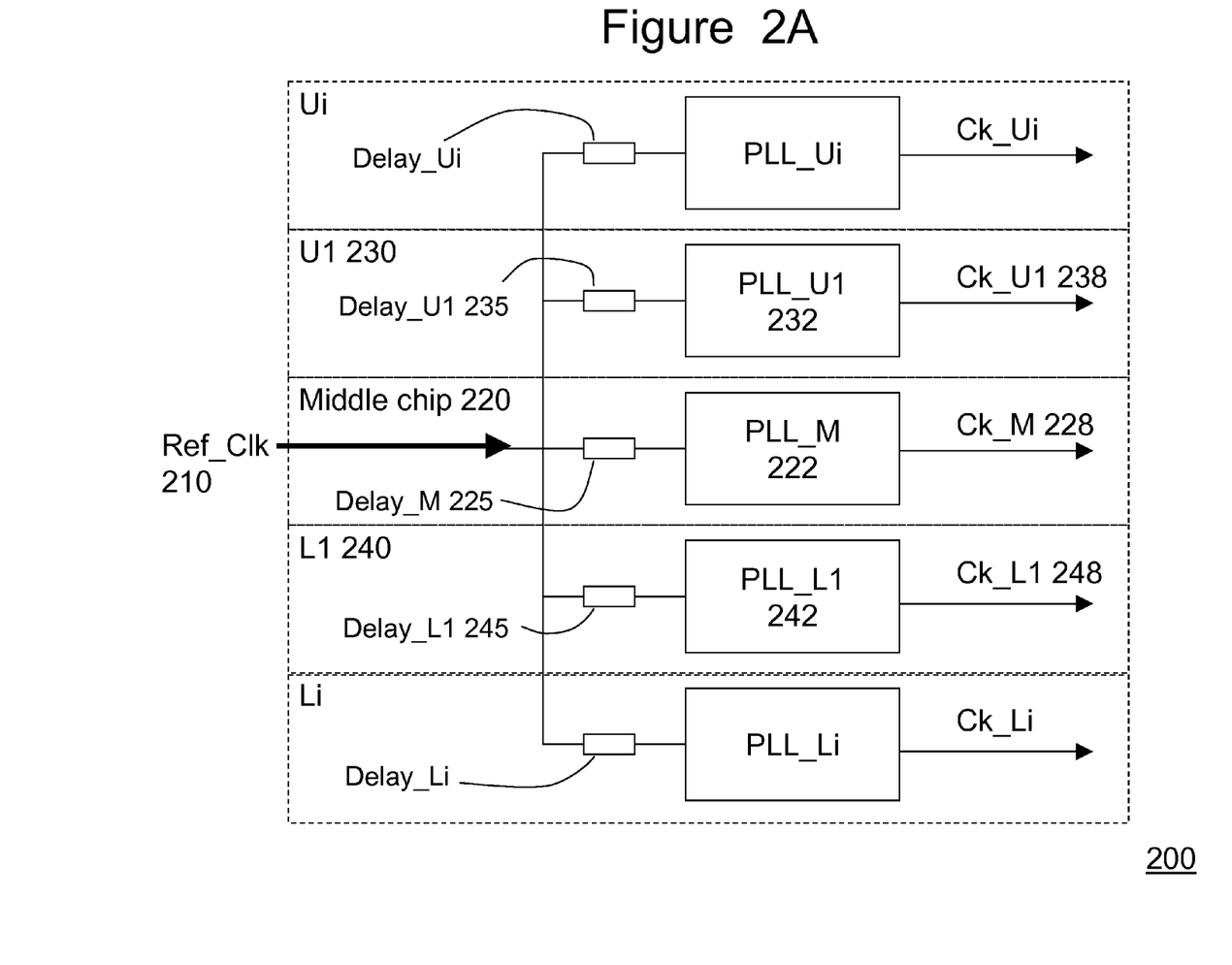
FIG. 2A is a schematic diagram of a master clock positioned in the middle chip and a slave clock for each child chip of the 3-D stack, according to an embodiment of the present invention.

Referring to FIG. 2A, there is shown a first embodiment of circuit block diagram 200 illustrating the clock generation and synchronization of individual chips forming the 3-D stack. The central reference clock (Ref_Clk) 210 is located in the middle chip, which is fed to a conventional phase-lock-loop circuit (PLL_M) 220 to provide a clock for the middle chip 204. It is essential that a delay element (Delay_M) 225 be placed in the vicinity of the PLL link, preferably between the central reference clock 210 and the PLL_M circuit 220, in order to compensate for the worst impedance and to match the RC time constant for all the chips forming the stack.

An optimum configuration is determined to distribute the reference clock to each individual chip forming the 3-D stack in synchronous. The output of the central reference clock 210 in the middle chip is routed to each child chip (i.e., chips that are above or below the middle chip, via the corresponding PLL link with a predetermined delay element, as shown in FIG. 2A. For example, Delay_U1 235 (or Delay_L1 245) is inserted in the PLL link between Ref_Clk 210 and PLL_U1 232 (or PLL_L1 242). With this arrangement, it is expected that the corresponding slave clock Ck_U1 238 on chip U1 230 (or Ck_L1 248 on chip L1 240) will be synchronized.

Figure 2B:
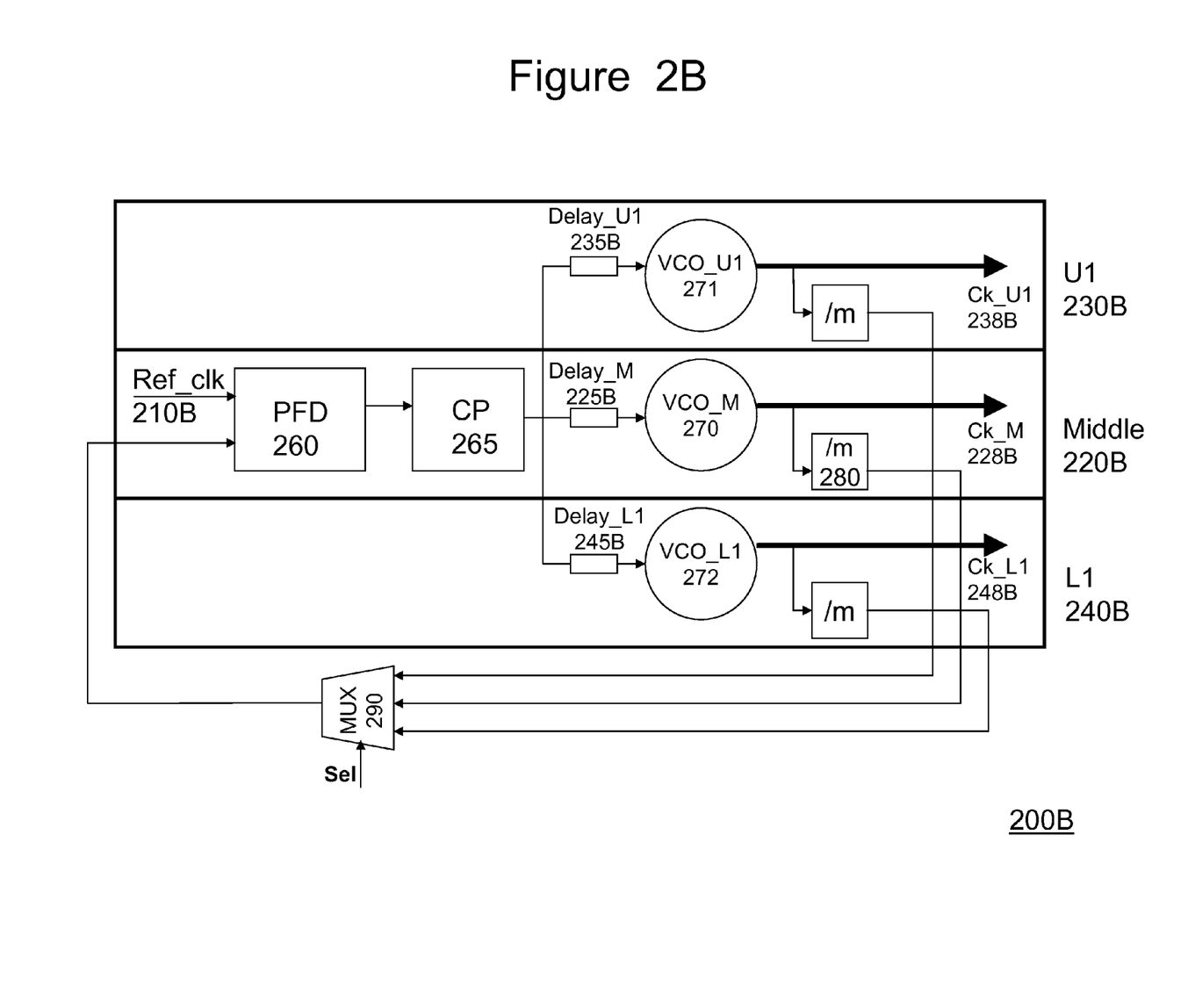
FIG. 2B is a schematic diagram of a master clock in the middle chip and a slave clock signal generator for each child chip in the 3-D stack, according to an embodiment of the present invention.

Referring to FIG. 2B, in another embodiment illustrated by circuit 200B demonstrates how clock signals are generated and distributed between the individual chips forming the 3-D stack. The central reference clock (Ref_Clk) 210B is located in the middle chip 220B and is fed to the PLL-based master clock generator placed in the middle chip that consists of a phase-frequency-detector 260 (PFD), a charge pump 265 (CP), a voltage-controlled oscillator 270 (VCO_M) and a divider 280 (/m). The output of VCO_M 270 provides the master clock signal 228B (Ck_M) for the middle chip. Note that CP 265 in the middle chip is also linked to the local voltage-controlled oscillators (e.g., VCO_U1 271 on chip U1 230B, VCO_L1 272 on chip L1 240B, and the like) in the child chips, so that the local clock signals (e.g., Ck_U1 238B on chip U1 230B, Ck_L1 248B on chip L1 240B, and the like) that are generated are synchronized with the master clock signal Ck_M 228B in the middle chip 220B.

It is essential that a delay element be placed in the corresponding PLL link between the CP 265 in the middle chip and each VCO in every chip within the 3-D stack. For example, a delay element Delay_M 225B is placed in the PLL link between the CP 265 and VCO_M 270 in the middle chip 220B, and delay element Delay_U1 235B is placed in the PLL link between the CP 265 in the middle chip and VCO_U1 271 on the upper child chip U1 230B. As mentioned previously, the various delay elements within the stack are necessary in order to compensate for the worst impedance for all the chips in the stack and to match the RC time constant for all the chips in the stack.

It is known that the quality of the clock signal degrades with time due to the increase in phase noise. By self-calibration with a periodic phase locking routine, the phase noise can be minimized to ensure high quality clock signals. Note, however, that there is only one PFD (i.e., 260) in the middle chip for phase locking in the structure depicted in FIG. 2B. In order to conduct periodic phase locking in synchronous for each of the local clock signal within the chip stack, a feedback path to the PFD 260 in the middle chip is provided for each local clock signal via its corresponding divider (/m). Since local clock signals need to be phase-locked one at a time, a multiplexer 290 (MUX) is inserted between the multiple dividers (/m) and the PFD 260 for signal selection. To conduct the self-calibration routine for the entire chip stack, the MUX 290 is scanned through each individual clock signal for phase locking.

It is also important to perform the calibration routine in a periodic manner to avoid any possible noise degradation with time. Assuming that there are N chips in the chip stack, and assuming that it takes a time $\Delta t$ (for MUX switching and phase locking) to calibrate each chip, then the self-calibration routine for the entire chip stack consumes a total time of N$\Delta t$. Consequently, it is preferable to have N$\Delta t$ equal or less than the period of the central reference clock ($T_{Clk\_ref}$), so that the self-calibration can be conducted continuously and in synchronous with the central reference clock.

In addition to the conventional electronic MUX switch, the clock MUX 290 illustrated in FIG. 2B can also be made of MEMS-based switch. The primary advantage of using MEMS-based switch within the feedback loop for clock self-calibration includes reduced jitter noise introduced in the system, which is essential for conducting the periodic phase locking routine in the 3-D clock system. On the other hand, in prior art, U.S. Pat. No. 6,526,112, there is neither a dummy load nor a delay element used. Thus, the slave clocks generated in each child chip cannot be synchronized with the master clock. This explains why the method described in the prior art can only be used to produce a plurality of clocks for transceiver channels on the same chip. Otherwise, the voltage coupled to VCO of the master clock will suffer from a significantly different drop before reaching each child chip.

Figure 3:
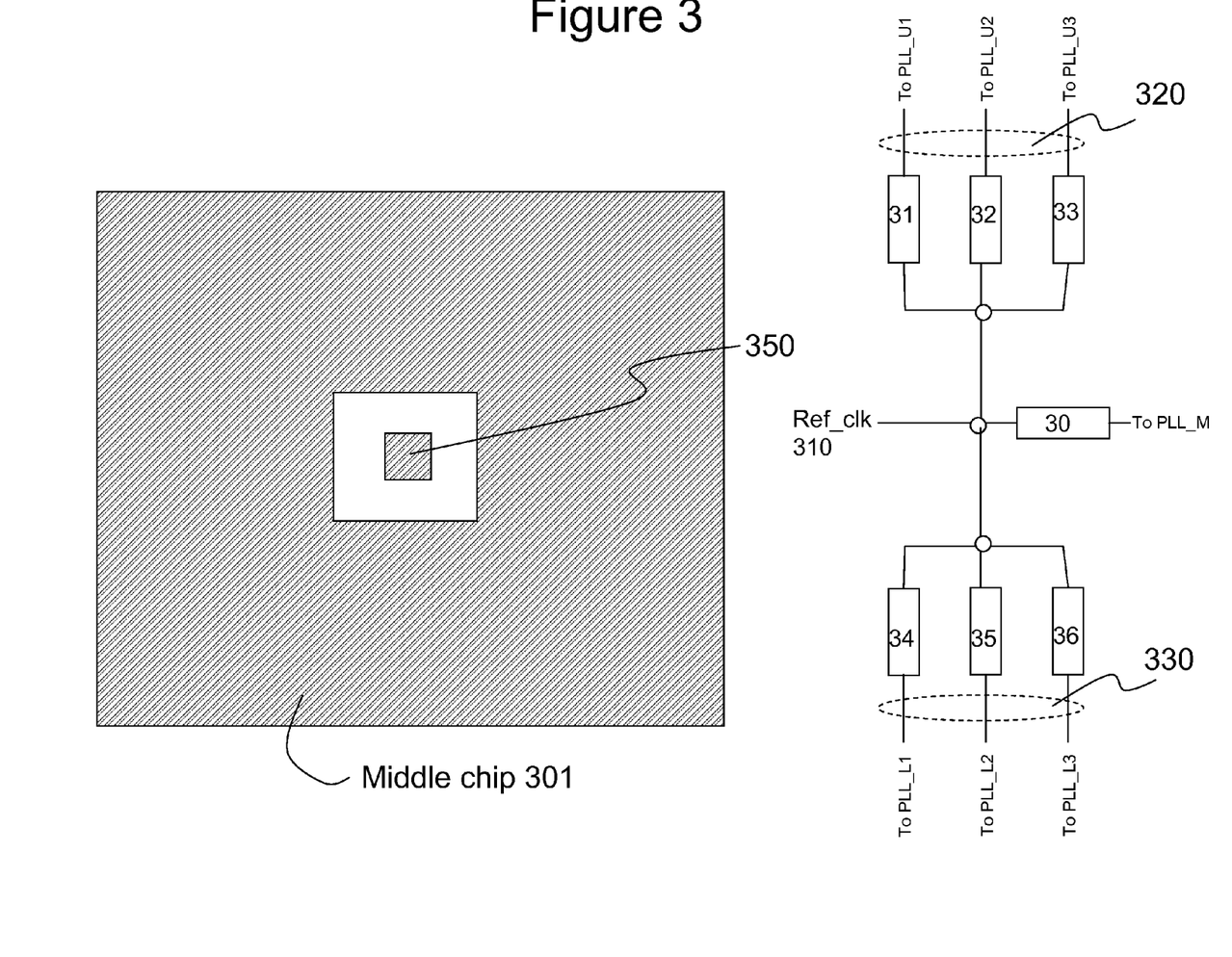
FIG. 3 shows a master clock generator positioned substantially in the center of the middle chip, and a diagram of the wire distribution system fanning-out to each child chip of the 3-D stack.

Referring to FIG. 3, there is shown a master clock generator preferably placed in the central area 350 of the middle chip 301. In the present example, since three chips are stacked above and three chips are stacked below the middle chip, only six local PLL links (to PLL_Ui and PLL_Li) are provided through corresponding delay element (31 to 36). The first three PLL links are used for the three upper chips and second three links are used for the three lower chips. Note that clock links are located in the center portion of the master clock generator. Similarly, the master clock itself has a delay element 30 inserted in between its PLL and the central reference clock Ref_clk 310 for synchronization purposes.

Figure 4:
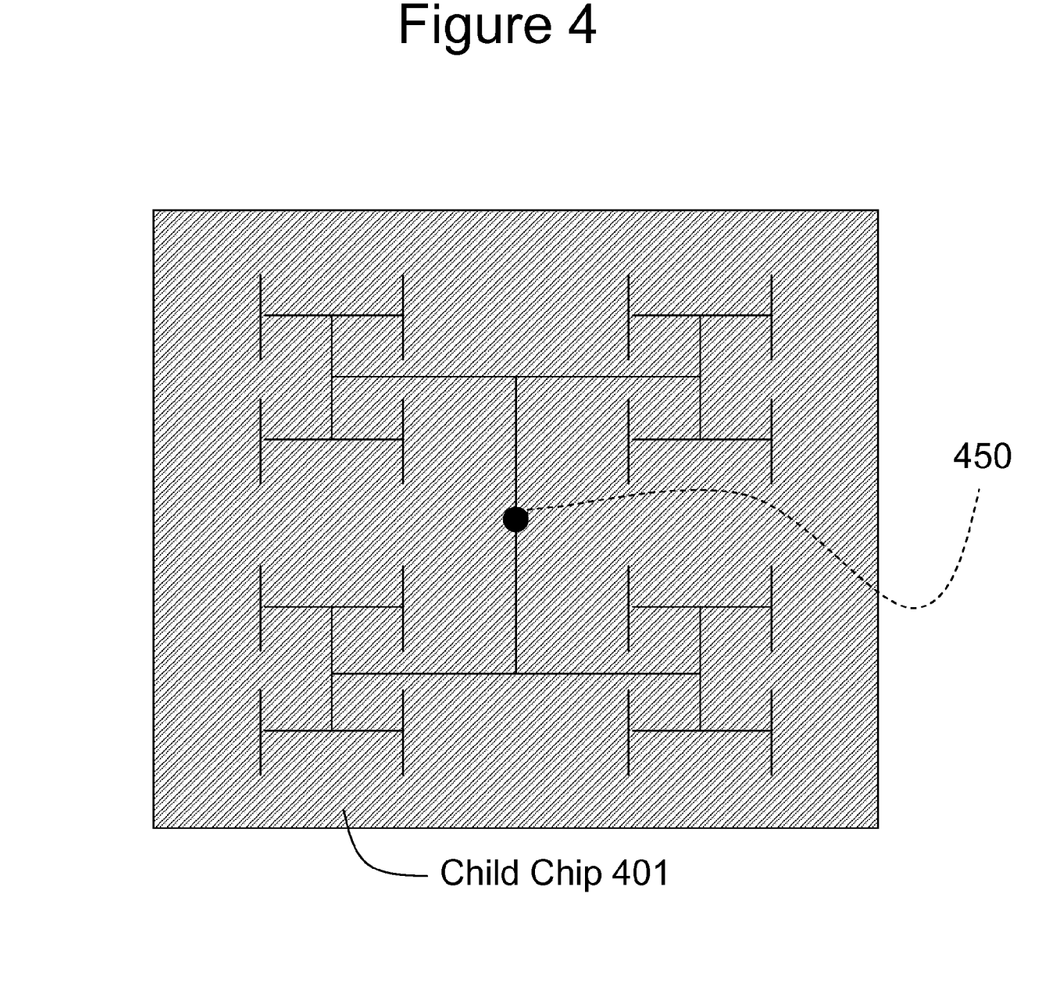
FIG. 4 shows a clock distribution diagram of a child chip within the 3-D stack.

Referring now to FIG. 4, a typical clock distribution diagram, such as H-tree, can be used within each chip forming the stack. The clock diagram is known in the art and will not be discussed further. Alternatively, the PLL link obtaining from the master clock generator is fed into the center portion 450 of a child chip 401. It is connected to the local PLL (not shown) and, thus, it generates a slave clock for this chip. Each slave clock is evenly distributed across the chip using such clock tree.

Figure 5:
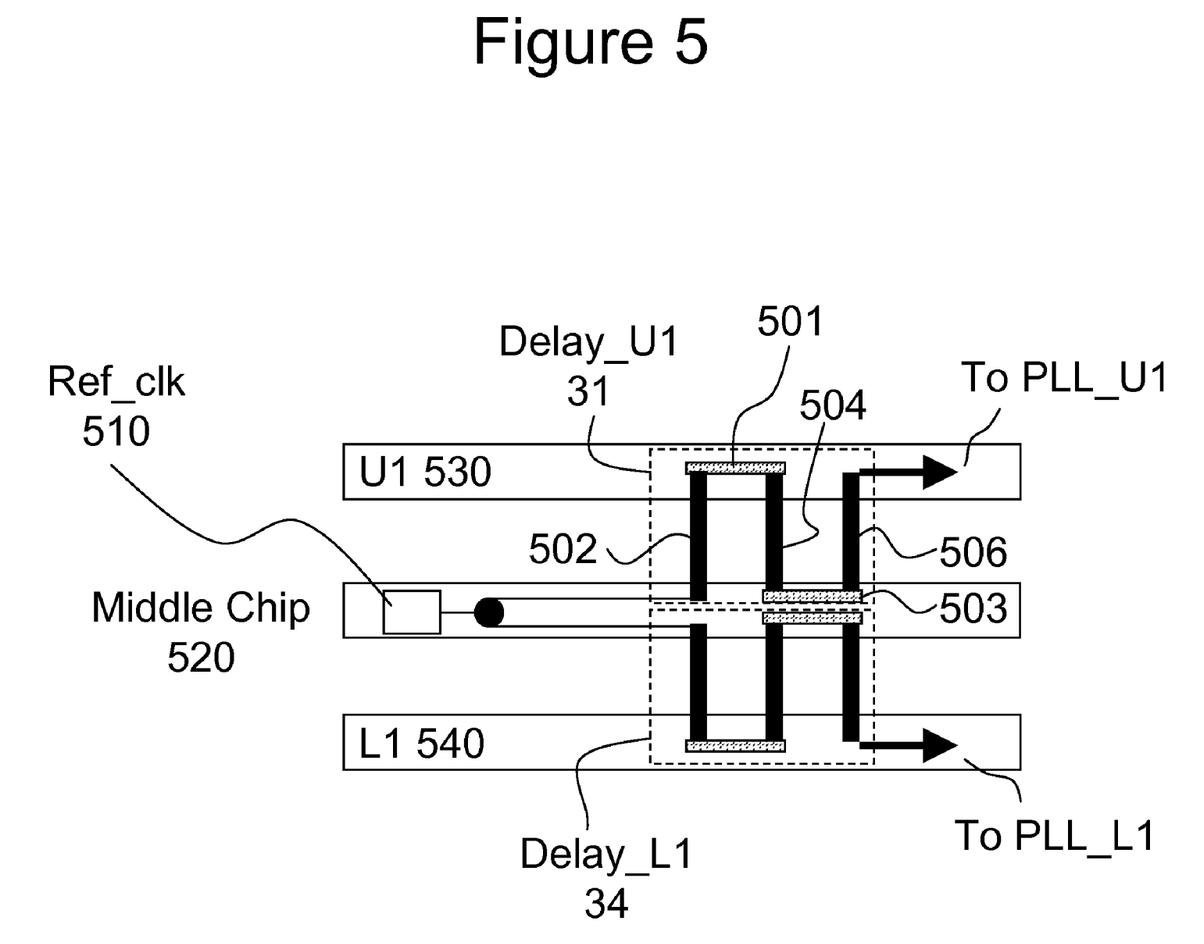
FIG. 5 is an illustrative example showing an arrangement connecting the central reference clock to a first chip above or below the middle chip of the 3-D stack, in which the reference clock signal in the child chips synchronized to the central reference clock is transmitted to the middle chip.

Shown in FIG. 5 is an example that illustrates how the first PLL link may be routed to the first pair of child chips (U1 530 and L1 540). The chips are located symmetrically above and below the middle chip 520 of the 3-D stack. To accommodate an overall system synchronization, three TSVs (502, 504 and 506) and two segments of on-chip wires (501 and 503) are preferably used for the delay element 31 and 34. The overall impedance through the described elements will be substantially the same for chips U1 530 and L1 540. The central reference clock 510 located in the middle chip 520 is routed to PLL_U1 and PLL_L1 via corresponding delay elements including 31 and 34. The goal is to provide delay elements for all the PLL links in order for them to provide substantially identical impedance before reaching each PLL in each corresponding child chip.

Figure 6:
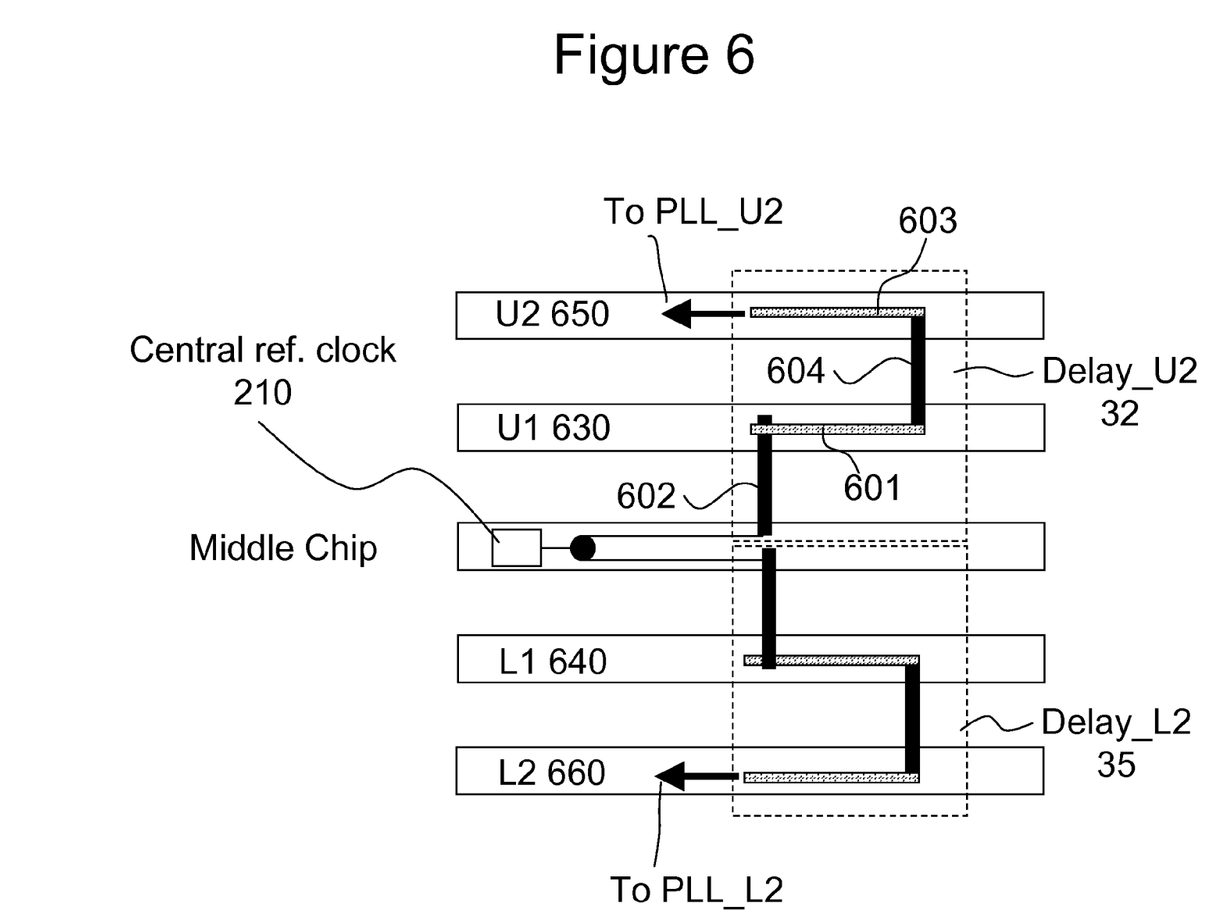
FIG. 6 shows an illustrative example of an arrangement that connects the central reference clock to a second chip above or below the first chip of the 3-D stack, wherein the reference clock signal in the child chips is synchronized to the central reference clock sending signals to the first chips.

Referring to FIG. 6, an illustrative example is shown that demonstrates how the second PLL links may be routed to the second pair of chips (U2 650 and L2 660). The chips are located immediately above and below the first pair of chips (U1 630 and L1 640) of the 3-D stack. To accommodate overall system synchronization, the delay elements 32 and 35 are formed by the use of two TSVs (602 and 604) and two segments of on-chip wires (601 and 603). Note that only two TSVs are employed for the delay setup on the second pair of chips (U2 and L2), instead of three for the first pair of chips (U1 and L1). Accordingly, longer on-chip wirings are advantageously used for compensation purposes in order to achieve identical impedance. The resulting overall impedance through these elements is made substantially identical to that of chips U1 and L1.

Figure 7:
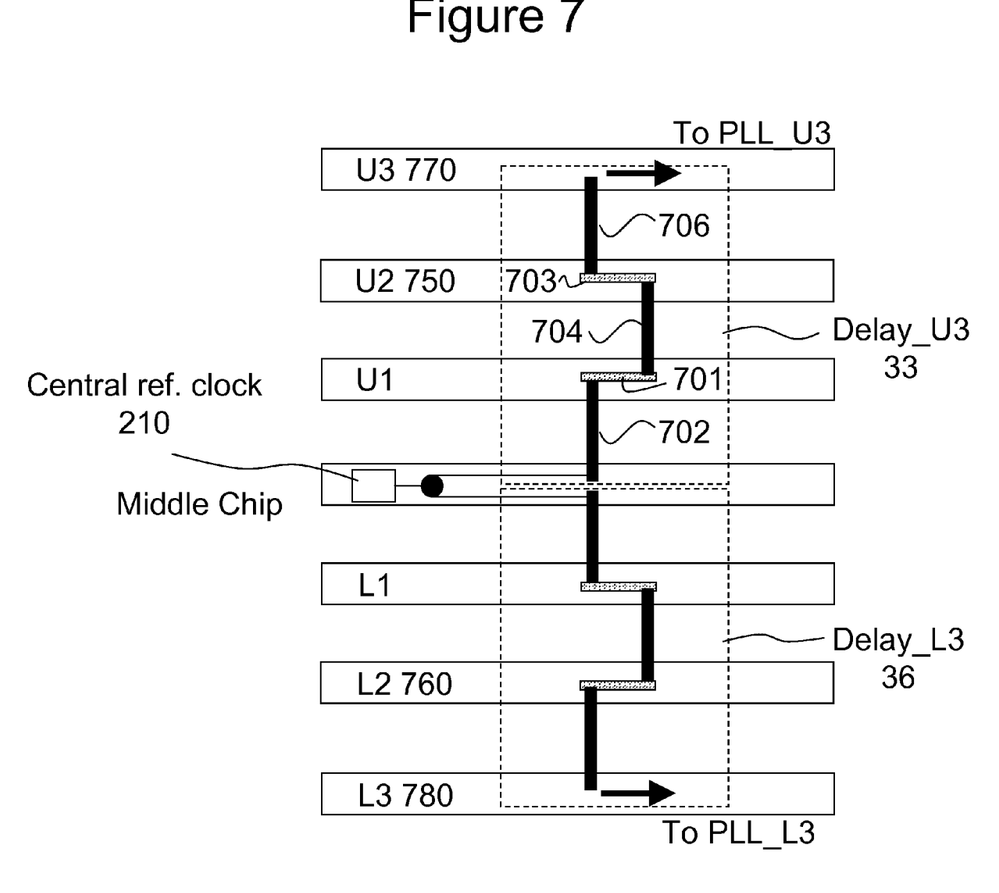
FIG. 7 shows an illustrative example of an arrangement connecting the central reference clock to a third chip above or below the second chips of the 3-D stack, wherein the reference clock signal in the child chips is synchronized to the reference clock sending signals to the first and second chips.

FIG. 7 shows another example that illustrates how the third PLL links may be routed on to the third pair of chips (U3 770 and L3 780). Chips are again placed above and below the second pair of chips (U2 750 and L2 760) within the 3-D stack. To accommodate overall system synchronization, the delay elements 33 and 36 are formed by the use of three TSVs (702, 704 and 706) and two segments of on-chip wires 701 and 703. The overall impedance through these delay elements 33 and 36 is made substantially identical for generating clock signals for chip U3 and L3. The impedance through delay elements 31 to 36 will be substantially identical to ensure overall clock synchronization.

Figure 8:
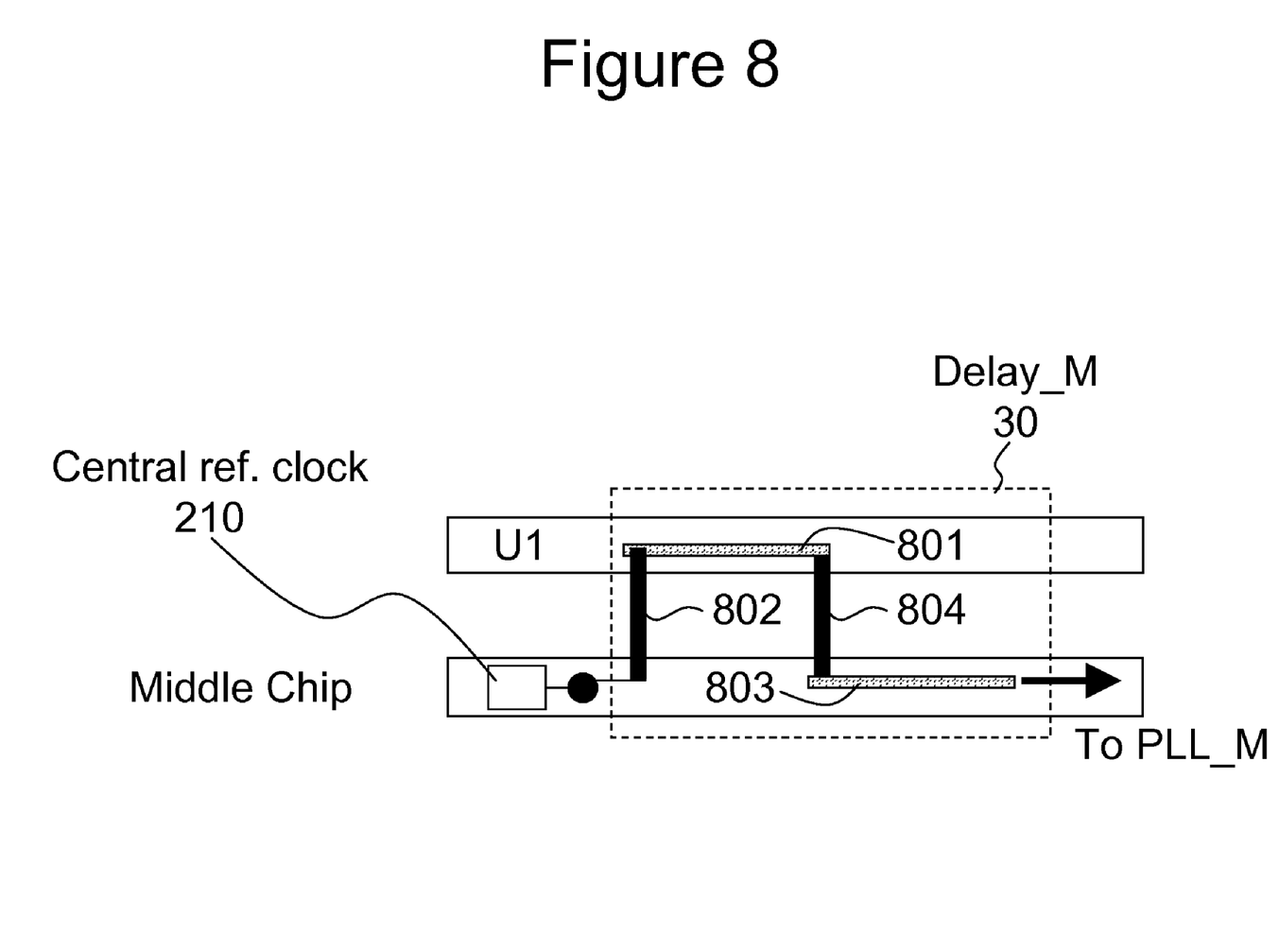
FIG. 8 shows an example illustrating how to wire the central reference clock to the middle chip and the first chip of the 3-D stack.

Referring now to FIG. 8, the delay element 30 of the master clock itself is arranged with similar number of TSVs (802 and 804) and on-chip wiring segments 801 and 803 to obtain the same impedance link between the central reference clock 210 and PLL_M in the middle chip.

Figure 9:
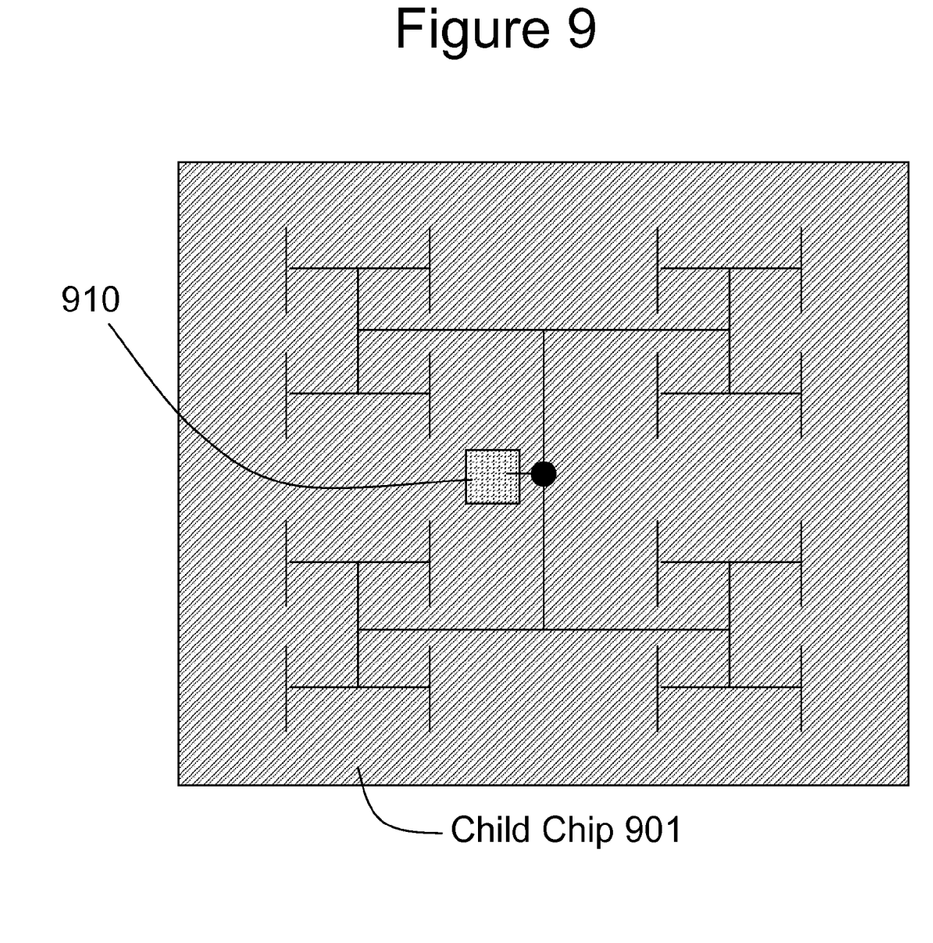
FIG. 9 is a schematic diagram of the clock distribution of a chip in the 3-D stack showing how a clock tuning device provides a coarse and a fine tuning of the reference clock.

Referring to FIG. 9, the local clock in each child chip can be equipped with a clock tuning device 910 which is able to provide coarse and fine tuning capabilities. A clock timing adjustment device is preferably used to conduct an automatic local clock timing adjustment in coarse and fine resolution steps. A local timer circuit with a counter is preferably provided to the master chip so that an incremental or decremental timing adjustment can be achieved with a predetermined timing step. In such an instance, the local clock tuning device can be advantageously used in combination with the delay elements to individually tune each local clock for each child chip in the 3-D stack against temperature, voltage and process variations. It further provides an effective, low-cost and accurate clock timing control for the 3-D stack.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A clock system of a synchronous 3-D-stack formed by a plurality of chips, comprising:
   a PLL-type master clock generator positioned in a middle chip located substantially in the middle of said 3-D-stack; and
   PLL links having substantially identical impedance, each PLL link servicing one of said plurality of chips, and connecting a central reference clock generated by said master clock generator located in said middle chip to a local PLL link corresponding to each of said plurality of chips.

2. The clock system as recited in claim 1 wherein said PLL links in each chip are identical to one another.

3. The clock system as recited in claim 1 wherein an output of said PLL link in each chip carries a substantially equal load.

4. The clock system as recited in claim 1 wherein said PLL link comprises a predetermined numbers of through-silicon-vias (TSVs).

5. The clock system as recited in claim 1 wherein said PLL-type master clock generator is located substantially in a central area of said middle chip.

6. The clock system as recited in claim 1 wherein each pair of chips stacked symmetrically above and below said middle chip receives PLL links from said master clock generator.

7. The clock system as recited in claim 6 wherein said paired PLL links comprise a predetermined number of TSVs and on-chip conductive wires, and wherein signal delays incoming and outgoing from each chip are substantially equal.

8. The clock system as recited in claim 1, wherein said clock tuning is performed during power-on period.

9. The clock system as recited in claim 1 wherein a central reference clock is fed to said PLL link located in said middle chip and distributed to all other PLL links located in the chips above and below said central chip forming said 3-D-stack.

10. A clock system of a synchronous 3-D-stack comprising:
    a PLL-typed master clock generator placed in a substantially middle chip;
    a per-chip PLL link having a substantially identical impedance connecting a central reference clock in said substantially middle chip and a local voltage-controlled oscillator (VCO) circuit positioned in a corresponding chip;
    a local VCO located in each chip feeding back a phase-frequency detector (PFD) on the substantially middle chip via a corresponding divider (/m); and
    a multiplexer (MUX) connected to a plurality of feedback paths and to said PFD for clock signal selection.

11. The clock system as recited in claim 10 wherein said VCOs in each chip are identical.

12. The clock system as recited in claim 10 wherein said VCO output in each chip carries a same load.

13. The clock system as recited in claim 10 wherein the MUX comprises electronic switches.

14. The clock system as recited in claim 10 wherein the MUX consists of MEMS based switches.

15. The clock system as recited in claim 14 wherein the MUX device can be formed on said middle chip of said 3-D-stack.

16. The clock system as recited in claim 10 wherein said PLL link comprises a predetermined numbers of TSVs.

17. The clock system as recited in claim 10 wherein said master clock generator is located substantially in a central area of said substantially middle chip.

18. The clock system as recited in claim 10 wherein each pair of chips stacked symmetrically above and below said middle chip receives PLL links from said master clock generator, said paired PLL links having essentially the same impedance.

19. The clock system as recited in claim 18 wherein said paired PLL links comprise predetermined number of TSVs and conductive wires or wire segments.

20. The clock system as recited in claim 18 wherein said generated clock signal at each chip is subjected to self-calibration with periodic phase locking for minimized phase noise.

21. The clock system as recited in claim 20, wherein said periodic phase locking is performed continuously during circuit operation.

22. A method of synchronizing a clock system of a 3-D-stack formed by a plurality of chips comprising:
    placing a PLL-type master clock generator in a chip substantially in the middle of said 3-D-stack; and
    respectively linking PLLs having a substantially identical impedance to each of said chips, and connecting each of said PLL links to a central reference clock located in said middle chip to a local PLL link corresponding to said chip.

23. The method as recited in claim 22, further comprising placing said PLL-type master clock generator substantially in a central area of said middle chip.

24. The method as recited in claim 22 further comprising stacking each pair of said chips symmetrically above and below said middle chip receiving PLL links from said master clock generator.

25. The method as recited in claim 22 further comprising pairing said PLL links by connecting a predetermined number of TSVs to on-chip conductive wires.

26. The method as recited in claim 22 further comprising loading an output of said PLL link in each chip with a substantially equal load.

* * * * *